(12) United States Patent
Kim et al.

(10) Patent No.: US 10,748,979 B2
(45) Date of Patent: Aug. 18, 2020

(54) DISPLAY DEVICE

(71) Applicant: Samsung Display Co., Ltd., Yongin-Si, Gyeonggi-Do (KR)

(72) Inventors: Dong Soo Kim, Yongin-si (KR); Won Kyu Kwak, Yongin-si (KR); Hyun Woong Kim, Yongin-si (KR); Joong Soo Moon, Yongin-si (KR); Seung Woo Sung, Yongin-si (KR); Seung Kyu Lee, Yongin-si (KR); Jung Hun Yi, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/273,002

(22) Filed: Feb. 11, 2019

(65) Prior Publication Data
US 2019/0363151 A1    Nov. 28, 2019

(30) Foreign Application Priority Data

May 28, 2018  (KR) .................. 10-2018-0060577

(51) Int. Cl.
| | |
|---|---|
| H01L 27/32 | (2006.01) |
| G09G 3/3233 | (2016.01) |
| G09G 3/3275 | (2016.01) |
| G09G 3/3266 | (2016.01) |
| H01L 51/52 | (2006.01) |

(52) U.S. Cl.
CPC ....... *H01L 27/3276* (2013.01); *G09G 3/3233* (2013.01); *G09G 3/3266* (2013.01); *G09G 3/3275* (2013.01); *H01L 27/3258* (2013.01); *H01L 27/3272* (2013.01); *G09G 2310/0278* (2013.01); *G09G 2310/08* (2013.01); *H01L 27/3246* (2013.01); *H01L 51/5237* (2013.01)

(58) Field of Classification Search
CPC .... H01L 27/32; G09G 3/3233; G09G 3/3266; G09G 3/3275
See application file for complete search history.

(56) References Cited

U.S. PATENT DOCUMENTS

| | | |
|---|---|---|
| 9,236,484 B2 | 1/2016 | Kim et al. |
| 2018/0061908 A1* | 3/2018 | Shim ............... H01L 27/326 |

* cited by examiner

*Primary Examiner* — Joseph L Williams
(74) *Attorney, Agent, or Firm* — Innovation Counsel LLP

(57) ABSTRACT

A display device may include a scan line, a data line, a power line, a substrate, a transistor, a light emitting device, a light shielding member, and a shielding layer. The scan line extends in a first direction and may transfer a scan signal. The data line extends in a second direction and may transfer a data signal. The power line is spaced from the data line and may transfer a driving voltage. The light emitting device is electrically connected to the transistor. The light shielding member is disposed between the substrate and the transistor. The shielding layer is electrically connected to the power line. The light shielding member includes a body member and a bridge member. The body member overlaps the transistor. The bridge member extends in the second direction from the body member and overlaps the shielding layer.

20 Claims, 12 Drawing Sheets

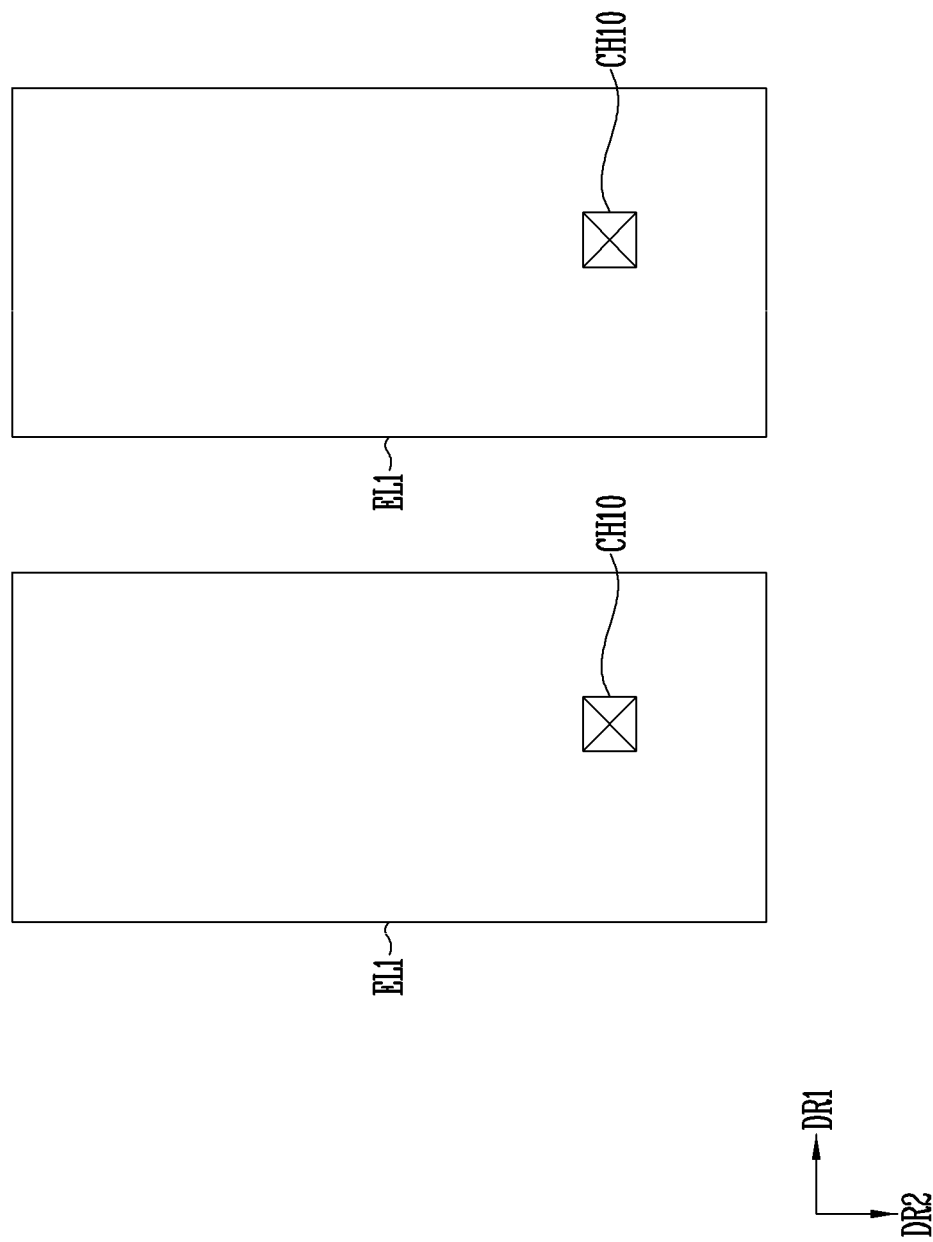

DISPLAY DEVICE

CROSS-REFERENCE TO RELATED APPLICATION

The present application claims priority under 35 U.S.C. § 119(a) to Korean patent application 10-2018-0060577 filed on May 28, 2018 in the Korean Intellectual Property Office; the entire disclosure of the Korean patent application is incorporated herein by reference.

BACKGROUND

1. Technical Field

The technical field relates to a display device.

2. Related Art

Portable information media may include display devices.

In a high resolution display device, the size of a pixel may be substantially small. At the same time, the structure of a circuit included in the pixel may be substantially complicated.

SUMMARY

Embodiments may be related a display device for displaying high resolution images.

According to an embodiment, a display device may include the following elements: a scan line extending in a first direction of a substrate, the scan line transferring a scan signal; a data line extending in a second direction intersecting the first direction, the data line transferring a data signal; a power line spaced apart from the data line, the power line transferring a driving voltage; a second transistor connected to the scan line and the data line, and a first transistor connected to the second transistor; a light emitting device connected to the first transistor; a light shielding pattern disposed between the substrate and the first transistor; and a shielding layer connected to the power line, wherein the light shielding pattern includes a body pattern overlapping with the first transistor and a bridge pattern extending along the second direction from the body pattern to overlap with the shielding layer.

The first transistor may include: a first active pattern disposed on the substrate; a first source electrode and a first drain electrode, each connected to the first active pattern; and a first gate electrode disposed on the first active pattern with a gate insulating layer interposed therebetween. The body pattern may overlap with the first gate electrode.

The first active pattern may be disposed on the light shielding pattern with a buffer layer interposed therebetween.

The display device may further include: a first interlayer insulating layer disposed over the first gate electrode; and a second interlayer insulating layer disposed over the shielding layer.

The bridge pattern may be electrically connected to the shielding layer through a first contact hole sequentially penetrating the first interlayer insulating layer, the gate insulating layer, and the buffer layer.

The scan line may include a first scan line transferring an (i−1)th (i is a natural number of 2 or more) scan signal and a second scan line transferring an ith scan signal. In a plan view, the first contact hole may be provided in a region between the first scan line and the second scan line.

The bridge pattern may overlap with the power line in the region between the first scan line and the second scan line.

The power line may be electrically connected to the shielding layer through a second contact hole penetrating the second interlayer insulating layer.

The driving voltage of the power line may be applied to the shielding layer and the bridge pattern.

The shielding layer may partially overlap with the data line, the power line, and the bridge pattern.

The display device may further include: a lower electrode disposed on the gate insulating layer; and an upper electrode disposed on the first interlayer insulating layer. The lower electrode and the upper electrode may constitute a storage capacitor with the first interlayer insulating layer interposed therebetween.

The lower electrode and the first gate electrode may be integrally provided in the same layer.

The upper electrode and the shielding layer may be provided in the same layer.

The display device may further include a third transistor including a third source electrode connected to the first drain electrode, a third drain electrode connected to a first node disposed between the first transistor and the light emitting device, and a third gate electrode connected to the second scan line.

In a plan view, the shielding layer may be disposed between the third transistor and the data line.

According to an embodiment, a display device may include the following elements: a substrate; a first scan line extending in a first direction of the substrate, the first scan line transferring an (i−1)th (i is a natural number of 2 or more) scan signal; a second scan line disposed under the first scan line in a plan view, the second scan line transferring an ith scan signal; a data line extending in a second direction, the data line intersecting the first and second scan lines, the data line transferring a data signal; a power line spaced apart from the data line, the power line transferring a driving voltage; a second transistor connected to the first and second scan lines and the data line, the second transistor being turned on in response to the ith scan signal; a first transistor connected to the second transistor; a light emitting device connected to the first transistor, the light emitting device emitting light; a light shielding pattern including a body pattern disposed between the substrate and an active pattern of the first transistor and a bridge pattern extending in the second direction from the body pattern to be connected to the power line; and a shielding layer connected to the power line, the shielding layer partially overlapping with the bridge pattern in a plan view, wherein the driving voltage of the power line is applied to the bridge pattern and the shielding layer.

The display device may further include: a buffer layer disposed over the light shielding pattern; a gate insulating layer disposed over the active pattern; and a first interlayer insulating layer disposed over the first and second scan lines. The bridge pattern may be electrically connected to the shielding layer through a first contact hole sequentially penetrating the first interlayer insulating layer, the gate insulating layer, and the buffer layer.

In a plan view, the first contact hole may be provided in a region between the first scan line and the second scan line.

The display device may further include a second interlayer insulating layer disposed between the shielding layer and the power line. The power line may be electrically connected to the shielding layer through a second contact hole penetrating the second interlayer insulating layer.

An embodiment may be related to a display device. The display device may include a first scan line, a data line, a power line, a substrate, a first transistor, a second transistor, a light emitting device, a light shielding member, and a shielding layer. The first scan line may extend in a first direction and may transfer a first scan signal. The data line may extend in a second direction different from the first direction and may transfer a data signal. The power line may be spaced from the data line and may transfer a driving voltage. The first transistor may overlap the substrate. The second transistor may be electrically connected to each of the first scan line, the data line, and the first transistor. The light emitting device is electrically connected to the first transistor. The light shielding member may be disposed between the substrate and the first transistor. The shielding layer is electrically connected to the power line. The light shielding member may include a body member and a bridge member. The body member may overlap the first transistor. The bridge member may be narrower than the body member in the first direction, may extend in the second direction from the body member, and may overlap the shielding layer.

The first transistor may include the following elements: a first semiconductor member; a first source electrode and a first drain electrode, each connected to the first semiconductor member; a first gate electrode overlapping the body member and overlapping the first semiconductor member; and a gate insulating layer disposed between the first gate electrode and the first semiconductor member. The first semiconductor member may be disposed between the body member and the first gate electrode.

The display device may include a buffer layer disposed between the first semiconductor member and the light shielding member.

The display device may include the following elements: a first interlayer insulating layer disposed between the first gate electrode and the shielding layer; and a second interlayer insulating layer disposed over the shielding layer.

The bridge member may be electrically connected to the shielding layer through a first conductive portion disposed inside a first contact hole extending through the first interlayer insulating layer, the gate insulating layer, and a portion of the buffer layer.

The display device may include a second scan line configured for transferring a second scan signal. No intervening scan line may be disposed between the first scan line and the second scan line. The first contact hole may be provided between the first scan line and the second scan line.

A portion of the bridge member may overlap the power line and may be positioned between the first scan line and the second scan line.

The power line may be electrically connected to the shielding layer through a second conductive portion disposed inside a second contact hole extending through the second interlayer insulating layer.

The driving voltage transferred by the power line may be applied to each of the shielding layer and the bridge member.

The shielding layer may partially overlap each of the data line, the power line, and the bridge member.

The display device may include the following elements: a first capacitor electrode disposed on the gate insulating layer; and a second capacitor electrode disposed on the first interlayer insulating layer. The first capacitor electrode and the second capacitor electrode constitute a storage capacitor. The first interlayer insulating layer may be interposed between the first capacitor electrode and the second capacitor electrode.

The first capacitor electrode and the first gate electrode may be directly connected to each other and may direct contact the same face of the gate insulating layer.

The second capacitor electrode and the shielding layer may direct contact the same face of the first interlayer insulating layer.

The display device may include a third transistor. The third transistor may include a third source electrode electrically connected to the first gate electrode, a third drain electrode electrically connected to a node disposed between the first transistor and the light emitting device, and a third gate electrode electrically connected to the second scan line.

A portion of the shielding layer may be disposed between the third transistor and the data line in a plan view of the display device.

The third transistor and the data line may be provided in different layers of the display device.

An embodiment may be related to a display device. The display device may include the following elements: a substrate; a first scan line extending in a first direction and configured for transferring a first scan signal; a second scan line spaced from the first scan line and configured for transferring a second scan signal, wherein no intervening scan line may be disposed between the first scan line and the second scan line; a data line extending in a second direction, intersecting each of the first scan line and the second scan line, and configured for transferring a data signal; a power line spaced apart from the data line and configured for transferring a driving voltage; a substrate; a first transistor overlapping the substrate and comprising a semiconductor member; a second transistor electrically connected to each of the first transistor, the first scan line, the second scan line, and the data line, the second transistor being configured to turn on in response to the second scan signal; a light emitting device electrically connected to the first transistor and configured for emitting light; a light shielding member including a body member and a bridge member, the body member being disposed between the substrate and the semiconductor member of the first transistor, the bridge member extending in the second direction from the body member and being electrically connected to the power line; and a shielding layer partially overlapping the bridge member. The bridge member may be electrically connected to the power line through the shielding layer.

The display device may include the following elements: a buffer layer disposed over the light shielding member; a gate insulating layer disposed over the semiconductor member; and a first interlayer insulating layer disposed over the first scan line and the second scan line. The bridge member may be electrically connected to the shielding layer through a first conductive portion disposed inside a first contact hole extending through the first interlayer insulating layer, the gate insulating layer, and a portion of the buffer layer.

The first contact hole may be provided between the first scan line and the second scan line.

The display device may include a second interlayer insulating layer disposed between the shielding layer and the power line. The power line may be electrically connected to the shielding layer through a second conductive portion disposed inside a second contact hole extending through the second interlayer insulating layer.

BRIEF DESCRIPTION OF THE DRAWINGS

FIG. 7, FIG. 8, FIG. 9, FIG. 10, FIG. 11, FIG. 11, and FIG. 12 are layout/plan views schematically illustrating components of pixels (e.g., the pixels shown in FIG. 4, FIG. 5, and/or FIG. 6) in different layers of a display device according to an embodiment.

DETAILED DESCRIPTION

Figure 1:
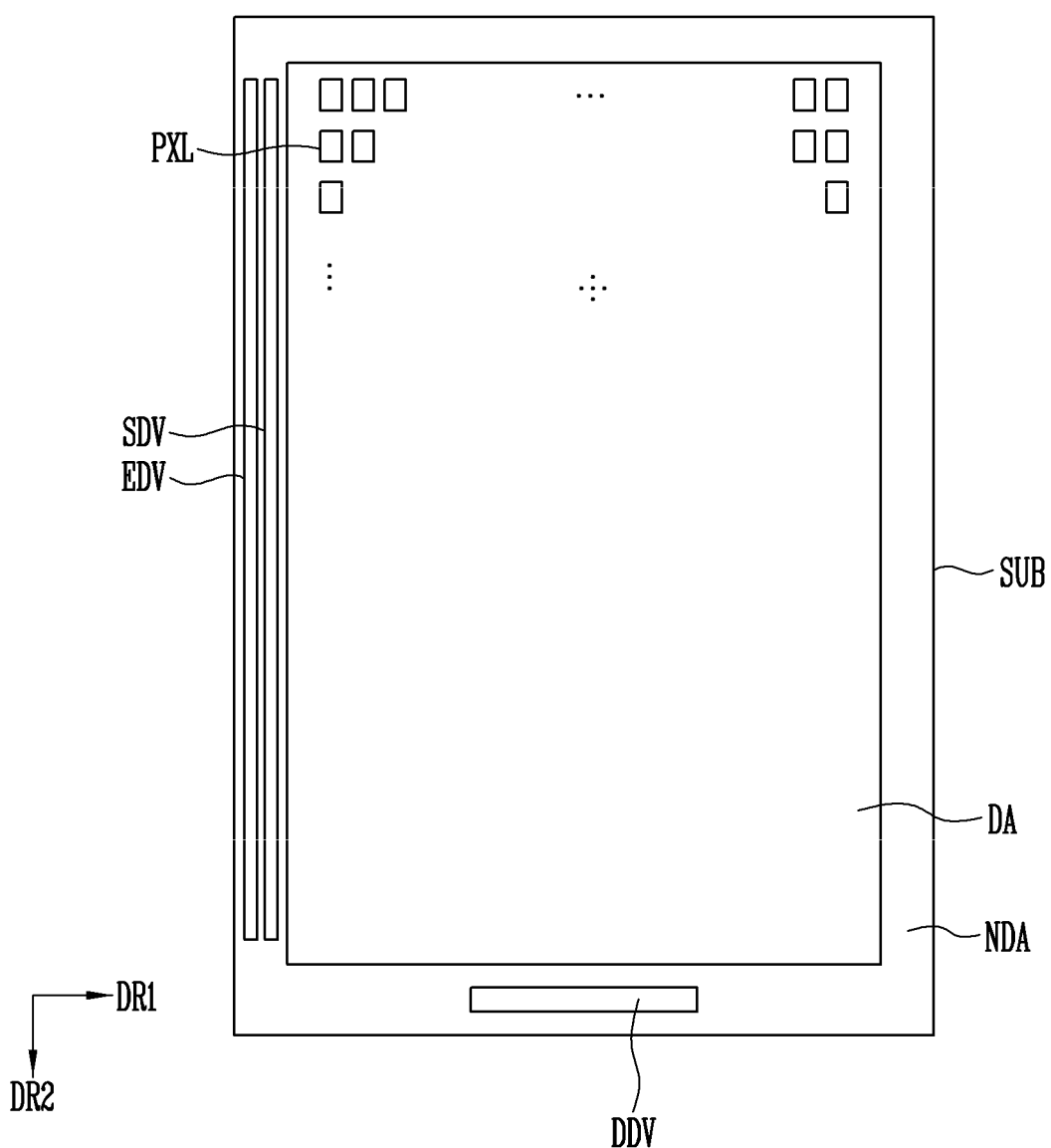
FIG. 1 is a plan view illustrating a display device according to an embodiment.

Example embodiments are described with reference to the drawings.

Like numbers may refer to like elements. In the drawings, thicknesses of lines, layers, components, elements, or features may be exaggerated for clarity.

Although the terms "first," "second," etc. may be used herein to describe various elements, these elements should not be limited by these terms. These terms are used to distinguish one element from another element. Thus, a "first" element could also be termed a "second" element without departing from the teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively. As used herein, singular forms may include plural forms as well, unless the context clearly indicates otherwise.

The terms "includes" and/or "including" may specify the presence of stated features, integers, steps, operations, elements, and/or components, but do not preclude the presence and/or addition of one or more other features, integers, steps, operations, elements, components, and/or groups.

The term "pattern" may mean "member"; the term "active pattern" may mean "semiconductor member"; the term "overlap with" may mean "overlap"; the term "connect" may mean "electrically connect"; the term "insulate" may mean "electrically insulate" or "electrically isolate"; the term "transfer" may mean "transmit."

FIG. 1 is a plan view illustrating a display device according to an embodiment.

Referring to FIG. 1, the display device may include a substrate SUB, pixels PXL provided on the substrate SUB, a driving unit that is provided on the substrate SUB and drives the pixels PXL, and conductive lines (not shown) that connect the pixels PXL and the driving unit.

The substrate SUB may include a display region DA and a non-display region NDA. The display region DA may be a region in which the pixels PXL for displaying an image are provided. The non-display region NDA may be a region in which a driving unit for driving the pixels PXL and some of the conductive lines (not shown) are provided.

The display region DA may have at least one of various shapes. For example, the display region DA may be provided in at least one of various shapes such as a closed polygon including linear sides, a circle, an ellipse, etc., including curved sides, and a semicircle, a semi-ellipse, etc., including linear and curved sides.

When the display region DA includes a plurality of regions, each region may be provided in at least one of various shapes such as a closed polygon including linear sides, a circle, an ellipse, etc., including curved sides, and a semicircle, a semi-ellipse, etc., including linear and curved sides. The areas of the regions may be the same or different from one another.

In an embodiment, the display region DA has a quadrangular shape including linear sides.

The non-display area NDA may be provided at one or more sides of the display area DA. In an embodiment, the non-display area NDA may surround the circumference of the display region DA. In an embodiment, the non-display region NDA may include a lateral part extending in the width direction and a longitudinal part extending the length direction. The longitudinal part of the non-display region NDA may be provided in a pair spaced from each other along the width direction of the display region DA.

The pixels PXL may be provided in the display region DA on the substrate SUB. Each of the pixels PXL is a minimum unit for displaying an image. Each of the pixels PXL may include a light emitting device that emits white light and/or colored light. Each pixel PXL may emit light of any one color among red, green, and blue. In an embodiment, the pixel PXL may emit light of one color among cyan, magenta, yellow, and white.

The pixels PXL may be arranged in a matrix form along rows extending in a first direction DR1 and columns extending in a second direction DR2 different from the first direction DR1. The driving unit provides signals for controlling the pixels PXL.

Figure 2:
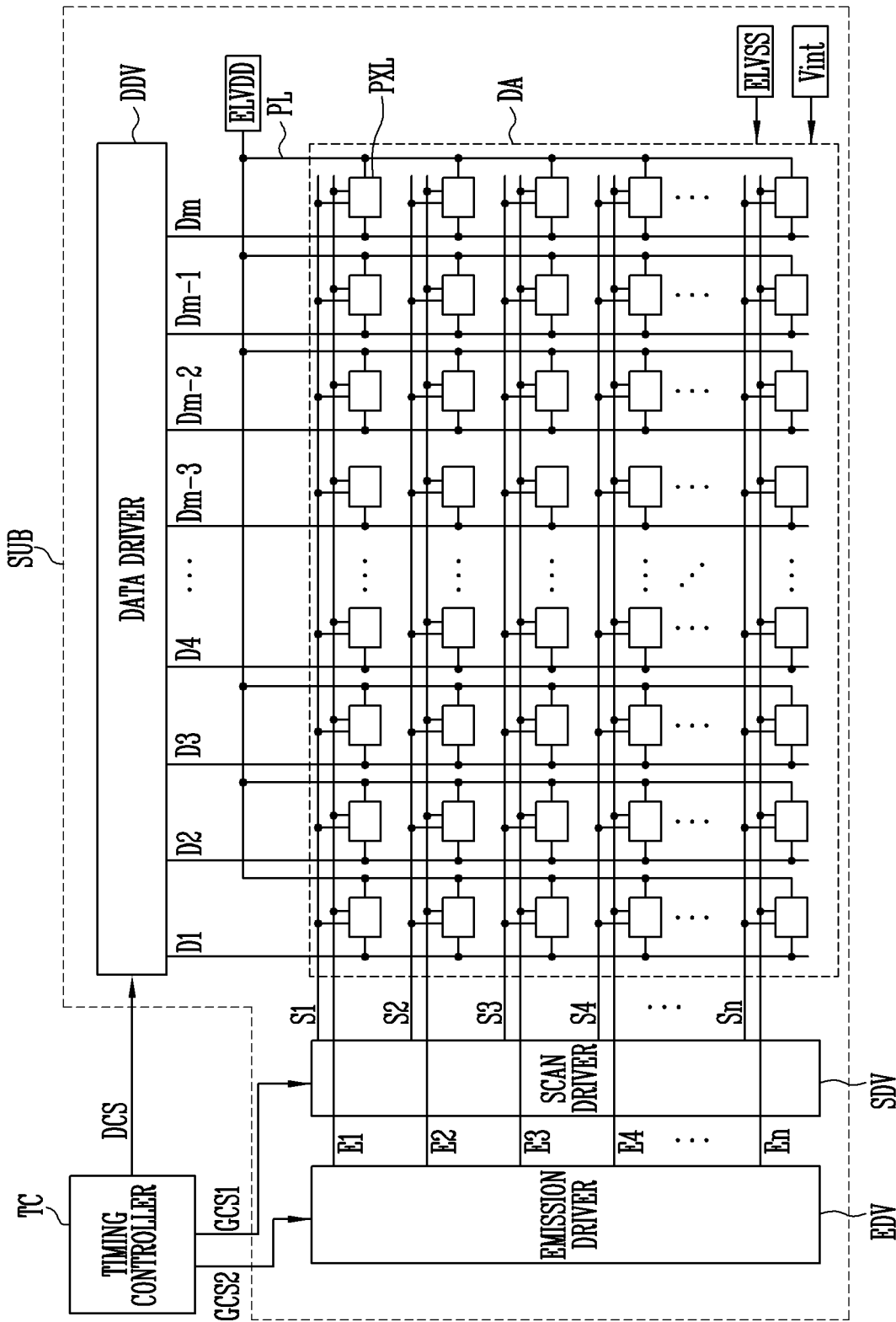
FIG. 2 is a block diagram illustrating pixels and a driving unit in the display device of FIG. 1 according to an embodiment.

The driving unit may include a scan driver SDV for providing scan signals to the pixels PXL through scan lines, an emission driver EDV for providing emission control signals to the pixels PXL through emission control lines, a data driver DDV for providing data signals to the pixels PXL through data lines, and a timing controller (shown in FIG. 2). The timing controller may control the scan driver SDV, the emission driver EDV, and the data driver DDV.

The scan driver SDV may be disposed at one or more longitudinal parts in the non-display region NDA. The scan driver SDV may extend along the length direction of the non-display region NDA.

The emission driver EDV may be disposed at one or more longitudinal parts in the non-display region NDA. The emission driver EDV may extend along the length direction of the non-display region NDA.

The data driver DDV may be disposed in the non-display region NDA. Particularly, the data driver DDV may be disposed at one or more lateral parts of the non-display region NDA. The data driver DDV may extend along the width direction of the non-display region NDA.

The positions of the scan driver SDV, the emission driver EDV, and/or the data driver DDV may be configured according to embodiments.

The timing controller (shown in FIG. 2) may be connected to the scan driver SDV, the emission driver EDV, and the data driver DDV through lines.

FIG. 2 is a block diagram illustrating the pixels and the driving unit in the display device of FIG. 1 according to an embodiment.

Referring to FIGS. 1 and 2, the display device may include pixels PXL, a driving unit, and conductive lines.

The driving unit may include a scan driver SDV, an emission driver EDV, a data driver DDV, and a timing controller TC.

The conductive lines may include scan lines, data lines, emission control lines, and one or more power lines PL, which are disposed in a display region DA of a substrate SUB to provide signals from the driving unit to the pixels PXL. The conductive lines may include an initialization power line (not shown) that provides an initialization voltage Vint to the pixels PXL.

The scan lines may include scan lines S1, S2, S3, S4 to Sn, the emission control lines may include emission control lines E1, E2, E3, E4 to En, and the data lines may include data lines D1, D2, D3, D4 to Dm-3, Dm-2, Dm-1, Dm.

The pixels PXL may be provided in the display region DA. When a scan signal is supplied from a scan line corresponding to a pixel PXL, the pixel PXL may be supplied with a data signal from a data line. The pixel PXL supplied with the data signal may control an amount of current flowing from a first pixel power source ELVDD provided through the power line PL to a second pixel power source ELVSS via a light emitting device (shown in FIG. 3).

The scan driver SDV may apply scan signals to the scan lines S1 to Sn in response to a first gate control signal GCS1 from the timing controller TC. For example, the scan driver SDV may sequentially supply scan signals to the scan lines S1 to Sn. When scan signals are sequentially supplied to the scan lines S1 to Sn, the pixels PXL may be sequentially selected in units of horizontal lines.

The emission driver EDV may apply emission control signals to the emission control lines E1 to En in response to a second gate control signal GCS2 from the timing controller TC. For example, the emission driver EDV may sequentially supply emission control signals to the emission control lines E1 to En.

An emission control signal may be longer than a scan signal. For example, an emission control signal supplied to an ith (i is a natural number of 2 or more) emission control line Ei may overlap with a scan signal supplied to an (i−1)th scan line Si−1 and a scan signal supplied to an ith scan line Si.

The data driver DDV may supply data signals to the data lines D1 to Dm in response to a data control signal DCS. The data signals may be supplied to pixels PXL selected by the scan signal.

The timing controller TC may supply, to the scan driver SDV and the emission driver EDV, gate control signals GCS1 and GCS2 generated based on timing signals supplied from an external device. The timing controller TC may supply a data control signal DCS to the data driver DDV.

A start pulse and clock signals may be included in each of the gate control signals GCS1 and GCS2. The start pulse controls a timing of a first scan signal or a first light emitting control signal. The clock signals are used to shift the start pulse.

A source start pulse and clock signals may be included in the data control signal DCS. The source start pulse controls a sampling start time of data. The color signals are used to control a sampling operation.

Figure 3:
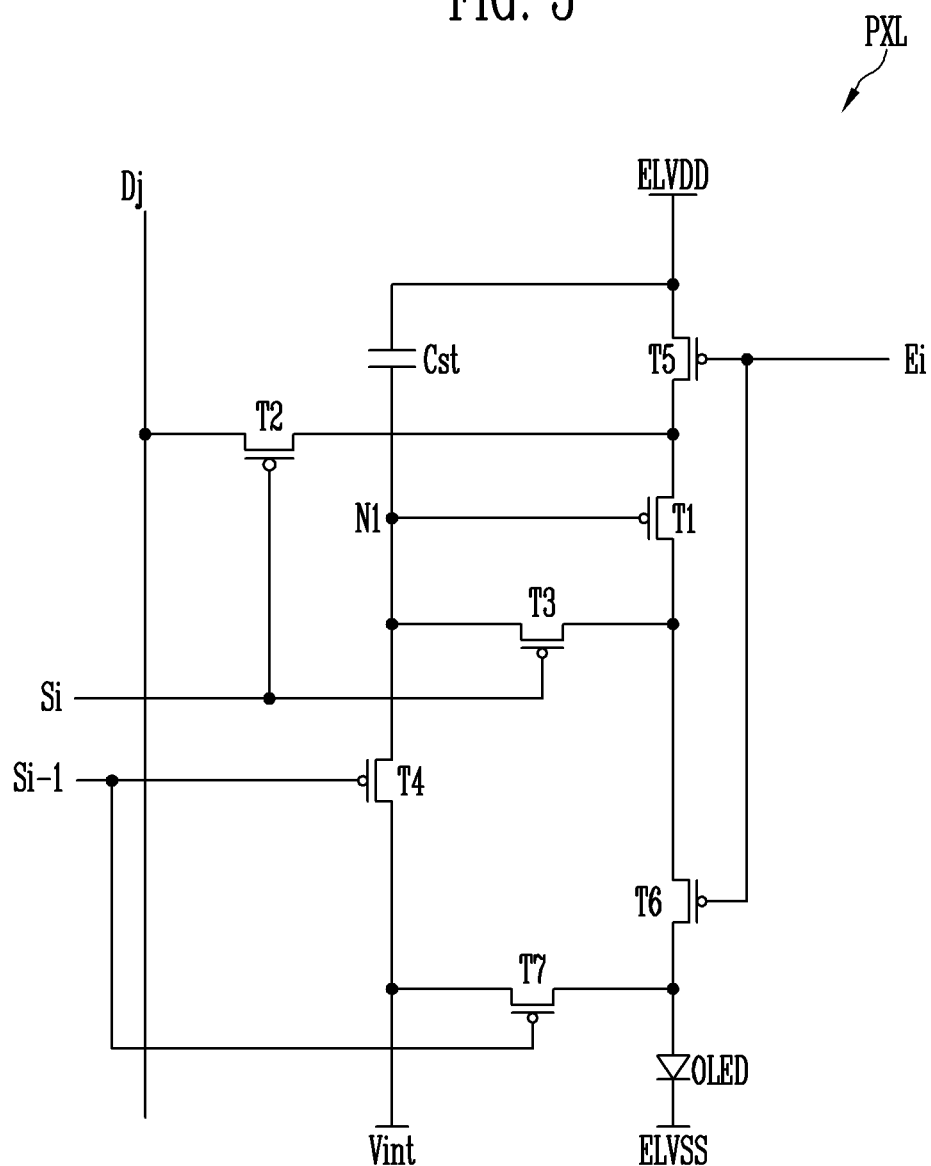
FIG. 3 is an equivalent circuit diagram illustrating one pixel among the pixels shown in FIG. 2 according to an embodiment.

FIG. 3 is an equivalent circuit diagram illustrating one pixel among the pixels shown in FIG. 2 according to an embodiment.

One pixel connected to a jth data line Dj, an (i−1)th scan line Si−1, and an ith scan line Si is illustrated in FIG. 3.

Referring to FIGS. 2 and 3, the pixel PXL according to the embodiment may include a light emitting device OLED, transistors T1 to T7, and a storage capacitor Cst.

An anode electrode of the light emitting device OLED is connected to the first transistor T1 via the sixth transistor T6, and a cathode electrode of the light emitting device OLED is connected to the second pixel power source ELVSS.

The light emitting device OLED may generate light with a luminance corresponding to an amount of current supplied from the first transistor T1. The first pixel power source ELVDD applied to the power line PL may be set to a voltage higher than that of the second pixel power source ELVSS such that a current can flow through the light emitting device OLED.

A source electrode of the first transistor (driving transistor) T1 is connected to the first pixel power source ELVDD via the fifth transistor T5, and a drain electrode of the first transistor T1 is connected to the anode electrode of the light emitting device OLED via the sixth transistor T6.

The first transistor T1 controls an amount of current flowing from the first pixel power source ELVDD to the second pixel power source ELVSS via the light emitting device OLED, corresponding to a voltage of a first node N1 that is connected to a gate electrode of the first transistor T1.

The second transistor (switching transistor) T2 is connected between a jth data line Dj and the source electrode of the first transistor T1. A gate electrode of the second transistor T2 is connected to an ith scan line Si.

The second transistor T2 is turned on when a scan signal is supplied to the ith scan line Si, to electrically connect the jth data line Dj and the source electrode of the first transistor T1. Therefore, a data signal transmitted by the jth data line Dj is transferred to the first transistor T1.

The third transistor T3 is connected between the drain electrode of the first transistor T1 and the first node N1. A gate electrode of the third transistor T3 is connected to the ith scan line Si.

The third transistor T3 is turned on when a scan signal is supplied to the ith scan line Si, to electrically connect the drain electrode of the first transistor T1 and the first node N1. Thus, the first transistor T1 is diode-connected when the third transistor T3 is turned on.

The fourth transistor T4 is connected between the first node N1 and an initialization power source Vint. A gate electrode of the fourth transistor T4 is connected to an (i−1)th scan line Si−1.

The fourth transistor T4 is turned on when a scan signal is supplied to the (i−1)th scan line Si−1, to supply the voltage of the initialization power source Vint to the first node N1. The initialization power source is set to a voltage lower than that of a data signal.

The fifth transistor T5 is connected between the first pixel power source ELVDD and the source electrode of the first transistor T1. A gate electrode of the fifth transistor T5 is connected to an ith emission control line Ei.

The fifth transistor T5 is turned off when an emission control signal is supplied to the ith emission control line Ei, and is turned on otherwise.

The sixth transistor T6 is connected between the drain electrode of the first transistor T1 and the anode electrode of the organic light emitting device OLED. A gate electrode of the sixth transistor T6 is connected to the ith emission control line Ei. The sixth transistor T6 is turned off when an emission control signal is supplied to the ith emission control line Ei, and is turned on otherwise.

The seventh transistor T7 is connected between the initialization power source Vint and the anode electrode of the light emitting device OLED. A gate electrode of the seventh transistor T7 is connected to the (i−1)th scan line Si−1.

The seventh transistor T7 is turned on when a scan signal is supplied to the (i−1)th scan line Si−1, to supply the voltage of the initialization power source Vint to the anode electrode of the light emitting device OLED.

The storage capacitor Cst is connected between the first pixel power source ELVDD and the first node N1. The storage capacitor Cst stores a voltage corresponding to the data signal and a threshold voltage of the first transistor T1.

In an embodiment, the light emitting device OLED may generate one or more of various lights including red, green, and blue, corresponding to the amount of current supplied from the first transistor T1.

In an embodiment, the first to seventh transistors T1 to T7 are implemented with P-type transistors. In an embodiment, the first to seventh transistors T1 to T7 may be implemented with N-type transistors.

Figure 4:
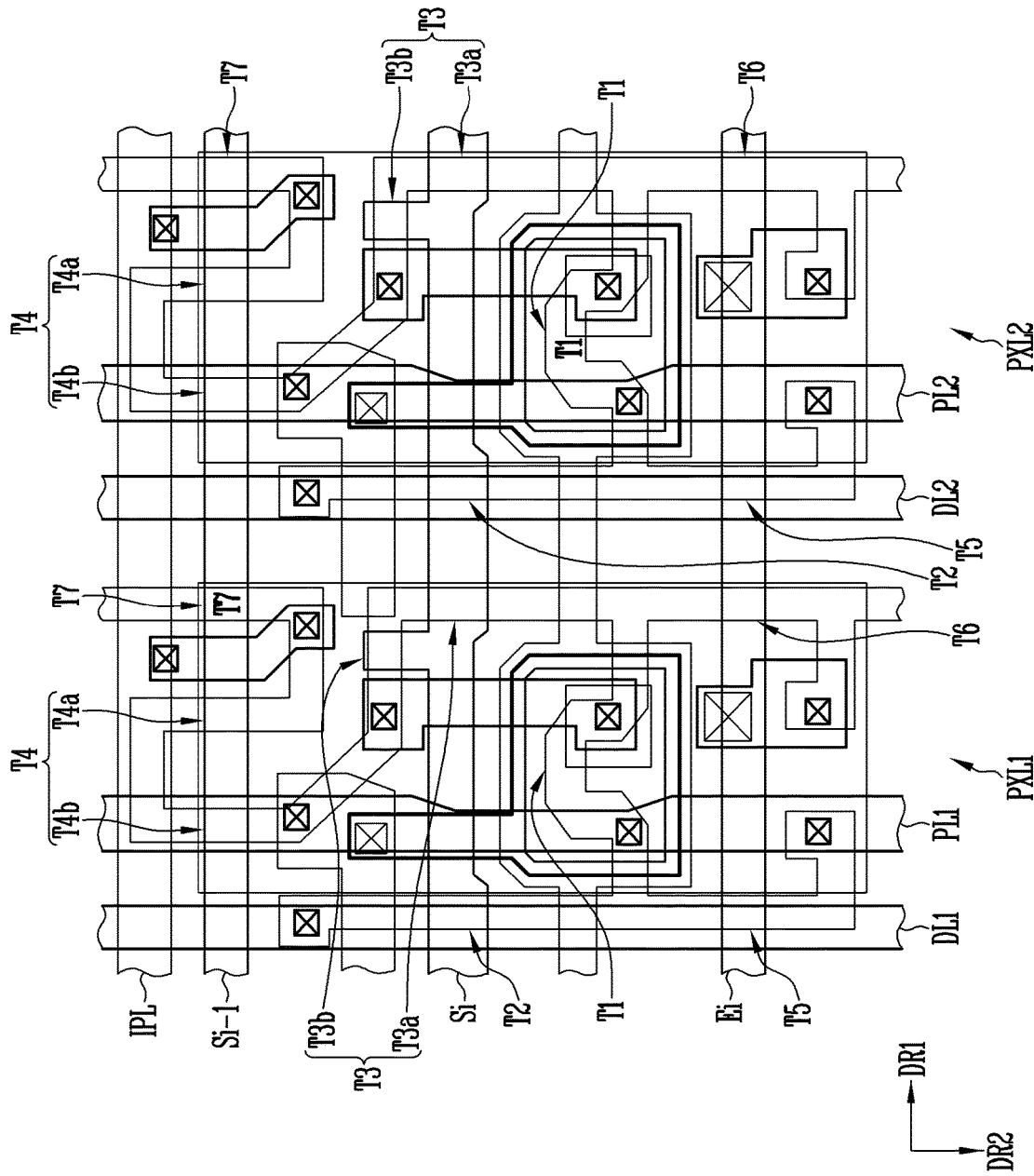
FIG. 4 and FIG. 5 are plan views illustrating elements in adjacent pixels in a display device according to an embodiment.
Figure 5:
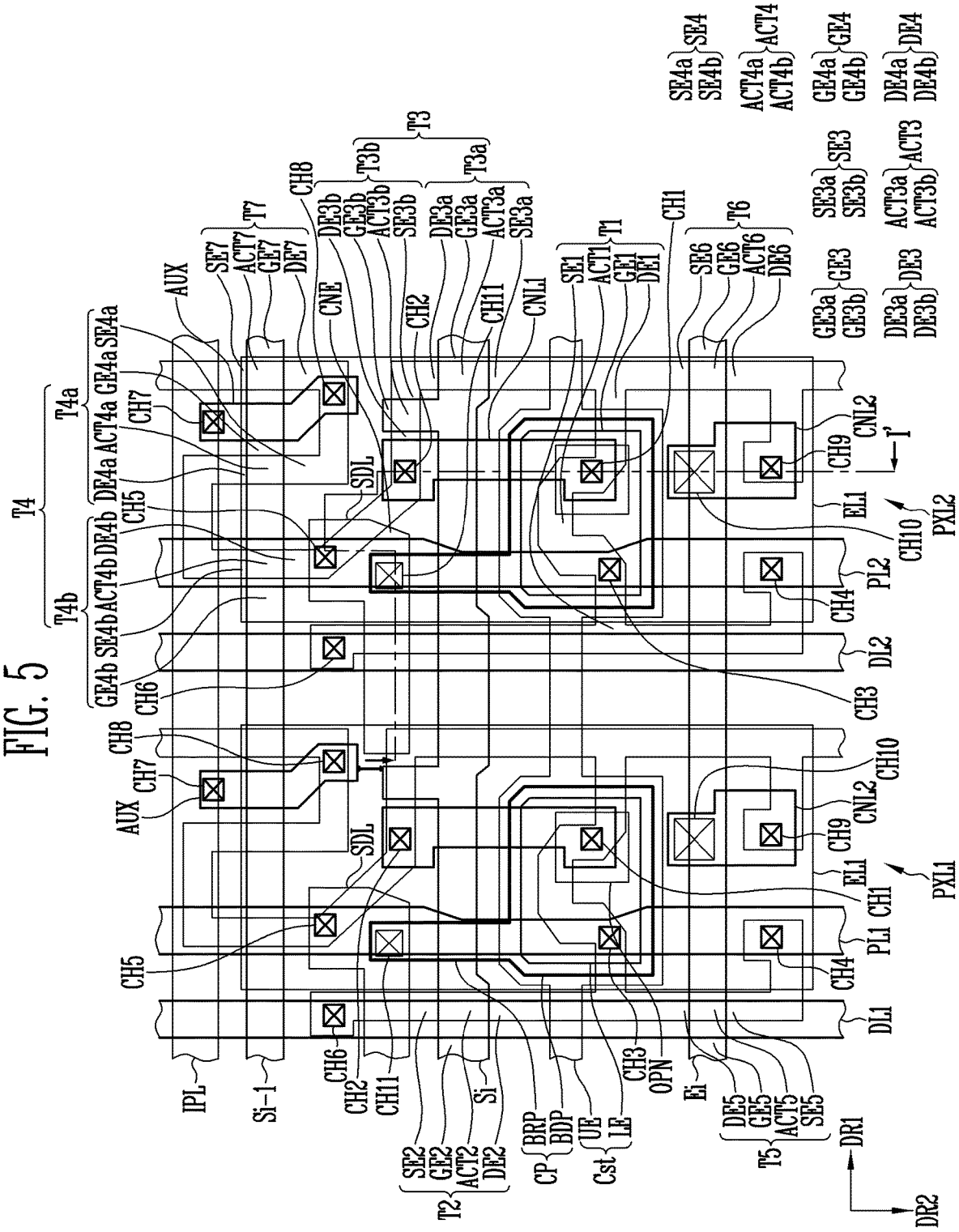
Figure 6:
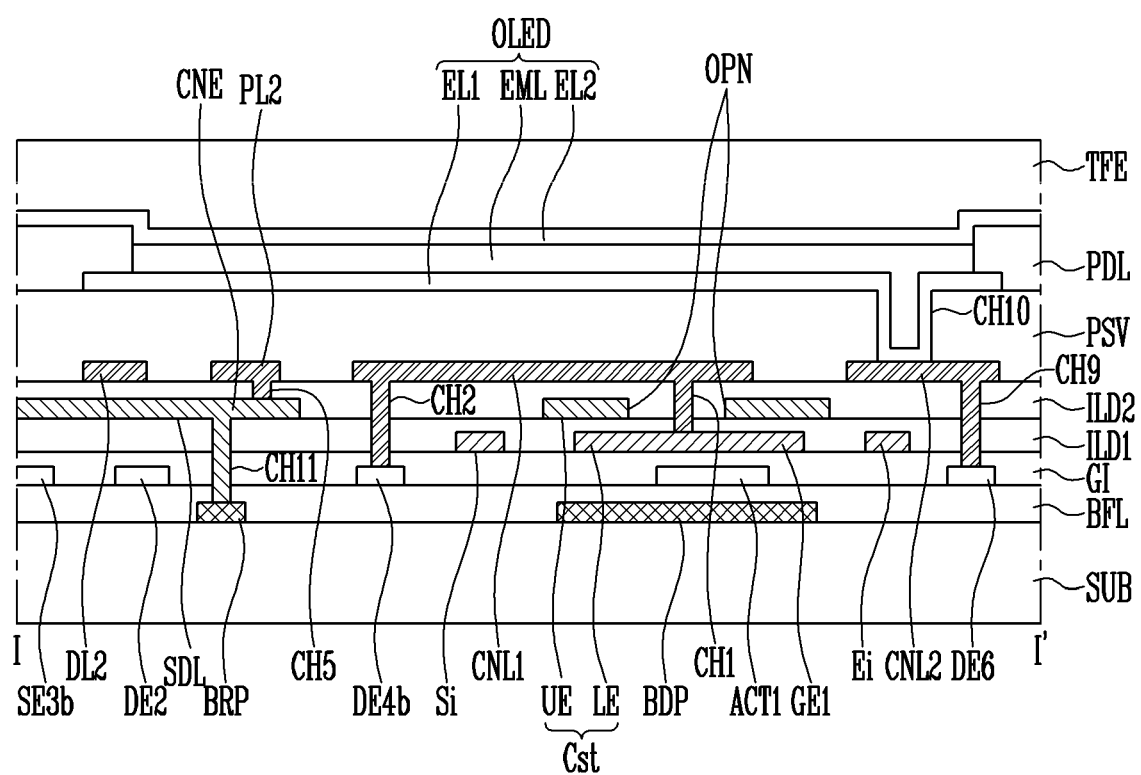
FIG. 6 is a cross-sectional view taken along line I-I' of FIG. 5 according to an embodiment.

FIGS. 4 and 5 are plan views illustrating elements in adjacent pixels in a display device according to an embodiment. FIG. 6 is a sectional view taken along line I-I' of FIG. 5 according to an embodiment.

FIG. 4 and FIG. 5 illustrate one pixel disposed on an ith row and a jth column in a display region, one pixel disposed on the ith row and a (j+1)th column in the display region, two scan lines, one emission control line, two data lines, and two power lines.

Referring to FIGS. 4 and 5, a scan line on an (i−1)th row is referred to as an '(i−1)th scan line Si−1,' a scan line on the ith row is referred to as an 'ith scan line Si,' and an emission control line on the ith row is referred to as an 'emission control line Ei.' A data line on the jth column is referred to as a 'first data line DL1,' a data line on the (j+1)th column is referred to as a 'second data line DL2,' a power line on the jth column is referred to as a 'first power line PL1,' and a power line on the (j+1)th column is referred to as a 'second power line PL2.'

Referring to FIGS. 4 and 5, one pixel connected to the (i−1)th scan line Si−1, the ith scan line Si, the emission control line Ei, and the first data line DL1 is referred to as a 'first pixel PXL1,' and one pixel connected to the (i−1)th scan line Si'1, the ith scan line Si, the emission control line Ei, and the second data line DL2 is referred to as a 'second pixel PXL2.'

Referring to FIGS. 1 to 6, the display device may include a substrate SUB, a line unit, and pixels PXL.

The substrate SUB may include an insulating material such as glass, organic polymer, or quartz. The substrate SUB may be made of a material having flexibility to be bendable or foldable. The substrate SUB may have a single-layered or multi-layered structure.

For example, the substrate SUB may include at least one of polystyrene (PS), polyvinyl alcohol (PVA), polymethyl methacrylate (PMMA), polyethersulfone (PES), polyacrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CP).

The conductive lines may provide signals to the pixels PXL and may include scan lines Si−1 and Si, data lines DL1 and DL2, an emission control line Ei, first and second power lines PL1 and PL2, and an initialization power line IPL.

A scan signal is provided to each of the scan lines Si−1 and Si. An (i−1)th scan signal is applied to the (i−1)th scan line Si−1, and an ith scan signal is applied to the ith scan line Si.

The emission control line Ei extends in the first direction DR1. An emission control signal is applied to the emission control line Ei.

A data signal is applied to each of the first and second data lines DL1 and DL2.

The first power line PL1 extends in the second direction DR2, and is spaced from the first data line DL1. The second power line PL2 extends in the second direction DR2, and is spaced from the second data line DL2.

The initialization power line IPL extends in the first direction DR1. The initialization power line IPL may be provided between the (i−1)th scan line Si−1 and an emission control line of the (i−1)th row.

The first pixel PXL1 and the second pixel PXL2 are arranged along the first direction DR1.

The scan lines Si−1 and Si, the emission control line Ei, the first data line DL1, the first power line PL1, and the initialization power line IPL are connected to the first pixel PXL1.

The scan lines Si−1 and Si, the emission control line Ei, the second data line DL2, the second power line PL2, and the initialization power line IPL are connected to the second pixel PXL2.

Each of the pixels PXL1 and PXL2 includes first to seventh transistors T1 to T7, a storage capacitor Cst, and a light emitting device OLED.

The first transistor T1 may include a first gate electrode GE1, a first active pattern ACT1, a first source electrode SE1, a first drain electrode DE1, and a first connection line CNL1.

The first gate electrode GE1 may be connected to the third transistor T3 and the fourth transistor T4 through the first connection line CNL1.

In an embodiment, the first source electrode SE1 and the first drain electrode DE1 may be portions of a semiconductor layer doped with impurity, and the active pattern ACT1 may be a portion of semiconductor layer not doped with the impurity.

The first active pattern ACT1 extends in a predetermined direction, and may have bends along the extending direction. The first active pattern ACT1 may overlap the first gate electrode GE1.

The first source electrode SE1 may be connected to one end of the first active pattern ACT1, a second drain electrode DE2 of the second transistor T2, and a fifth drain electrode DE5 of the fifth transistor T5.

The first drain electrode DE1 may be connected to the other end of the first active pattern ACT1, a third source electrode SE3 of the third transistor T3, and a sixth source electrode SE6 of the sixth transistor T6.

The second transistor T2 may include a second gate electrode GE2, a second active pattern ACT2, and a second source electrode SE2, and the second drain electrode DE2.

The second gate electrode GE2 may be connected to the ith scan line Si. The second gate electrode GE2 may be a portion of the ith scan line Si and/or may be protrude from the ith scan line Si.

In an embodiment, the second source electrode SE2 and the second drain electrode DE2 may be portions of a semiconductor doped with impurity, and the second active pattern ACT2 may be a portion of the semiconductor layer not doped with the impurity.

The second active pattern ACT2 may overlap the second gate electrode GE2.

The second source electrode SE2 may be connected to one end of the second active pattern ACT2 and may be connected to a corresponding data line through a sixth contact hole CH6.

Specifically, the second source electrode SE2 of the second transistor T2 of the first pixel PXL1 may be connected to the first data line DL1 through a sixth contact hole CH6, and the second source electrode SE2 of the second transistor T2 of the second pixel PXL2 may be connected to the second data line DL2 through a sixth contact hole CH6.

The second drain electrode DE2 may be connected to the other end of the second active pattern ACT2, the first source electrode SE1 of the first transistor T1, and the fifth drain electrode DE5 of the fifth transistor T5.

The third transistor T3 may be provided in a double gate structure so as to prevent a leakage current. For example, the third transistor T3 may include a transistor T3$a$ and a transistor T3$b$.

The transistor T3$a$ may include a gate electrode GE3$a$, an active pattern ACT3$a$, a source electrode SE3$a$, and a drain electrode DE3$a$. The transistor T3$b$ may include a gate electrode GE3$b$, an active pattern ACT3$a$, a source electrode SE3$b$, and a drain electrode DE3$b$.

In the description, the gate electrode GE3$a$ and the gate electrode GE3$b$ are referred to as a third gate electrode GE3, the active pattern ACT3$a$ and the active pattern ACT3$b$ are referred to as a third active pattern ACT3, the source electrode SE3$a$ and the source electrode SE3$b$ are referred to as the third source electrode SE3, and the drain electrode DE3$a$ and the drain electrode DE3$b$ are referred to as the third drain electrode DE3.

The third gate electrode GE3 may be connected to the ith scan line S1$i$. The third gate electrode GE3 may be a portion of the ith scan line Si and/or may protrude from the ith scan line Si.

The third source electrode SE3 and the third drain electrode DE3 may be portions of a semiconductor layer doped with impurity, and the third active pattern ACT3 may be a portion of semiconductor layer not doped with the impurity.

The third active pattern ACT3 may overlap the third gate electrode GE3.

The third source electrode SE3 may be connected to one end of the third active pattern ACT3, the first drain electrode DE1 of the first transistor T1, and the sixth source electrode SE6 of the sixth transistor T6.

The third drain electrode DE3 may be connected to the other end of the third active pattern ACT3 and may be connected to the fourth transistor T4. The third drain electrode DE3 may be connected to the first gate electrode GE1 of the first transistor T1 through contact holes CH1 and CH2 and the first connection line CNL1.

The fourth transistor T4 may be provided in a double gate structure so as to prevent a leakage current. For example, the fourth transistor T4 may include a transistor T4$a$ and a transistor T4$b$.

The transistor T4$a$ may include a gate electrode GE4$a$, an active pattern ACT4$a$, a source electrode SE4$a$, and a drain electrode DE4$a$, and the transistor T4$b$ may include a gate electrode GE4$b$, an active pattern ACT4$b$, a source electrode SE4$b$, and a drain electrode DE4$b$.

In the description, the gate electrode GE4$a$ and the gate electrode GE4$b$ are referred to as a fourth gate electrode GE4, the active pattern ACT4$a$ and the active pattern ACT4$b$ are referred to as a fourth active pattern ACT4, the source electrode SE4$a$ and the source electrode SE4$b$ are referred to as a fourth source electrode SE4, and the drain electrode DE4$a$ and the drain electrode DE4$b$ are referred to as the fourth drain electrode DE4.

The fourth gate electrode GE4 may be connected to the (i−1)th scan line Si−1. The fourth gate electrode GE4 may be a portion of the (i−1)th scan line Si−1 and/or may protrude from the (i−1)th scan line Si−1.

The fourth source electrode SE4 and the fourth drain electrode DE4 may be portions of a semiconductor layer doped with impurity, and the fourth active pattern ACT4 may be a portion of the semiconductor layer not doped with the impurity.

The fourth active pattern ACT4 may overlap the fourth gate electrode GE4.

The fourth source electrode SE4 may be connected to one end of the fourth active pattern ACT4, the initialization power line IPL, and a seventh drain electrode DE7 of the seventh transistor T7.

An auxiliary connection line AUX may be provided between the fourth source electrode SE4 and the initialization power line IPL. One end of the auxiliary connection line AUX may be connected to the initialization power line IPL through a seventh contact hole CH7, and the other end of the auxiliary connection line AUX may be connected to the fourth source electrode SE4 and the seventh drain electrode DE7 through an eighth contact hole CH8.

The fourth drain electrode DE4 may be connected to the other end of the fourth active pattern ACT4 and the third drain electrode DE3 of the third transistor T3. The fourth drain electrode DE4 may be connected to the first gate electrode GE1 of the first transistor T1 through the first connection line CNL1.

The fifth transistor T5 may include a fifth gate electrode GE5, a fifth active pattern ACT5, a fifth source electrode SE5, and the fifth drain electrode DE5.

The fifth gate electrode GE5 may be connected to the emission control line Ei. The fifth gate electrode GE5 may be a portion of the emission control line Ei and/or may protrude from the emission control line Ei.

The fifth source electrode SE5 and the fifth drain electrode DE5 may be portions of a semiconductor layer doped with impurity, and the fifth active pattern ACT5 may be a portion of the semiconductor layer not doped with the impurity.

The fifth active pattern ACT5 may overlap the fifth gate electrode GE5.

The fifth source electrode SE5 may be connected to one end of the fifth active pattern ACT5 and may be connected to a corresponding power line through a fourth contact hole CH4.

For example, the fifth source electrode SE5 of the fifth transistor T5 of the first pixel PXL1 may be connected to the first power line PL1 through a fourth contact hole CH4, and the fifth source electrode SE5 of the fifth transistor T5 of the second pixel PXL2 may be connected to the second power line PL2 through a fourth contact hole CH4.

The fifth drain electrode DE5 may be connected to the other end of the fifth active pattern ACT5. The fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode SE6 may be connected to the emission control line Ei. The sixth gate electrode SE6 may be a portion of the emission control line Ei and/or may protrude from the emission control line Ei.

For example, the sixth source electrode SE6 and the sixth drain electrode DE6 may be portions of a semiconductor layer doped with impurity, and the sixth active pattern ACT6 may be a portion of the semiconductor layer not doped with the impurity.

The sixth active pattern ACT6 may overlap the sixth gate electrode GE6.

The sixth source electrode SE6 may be connected to one end of the sixth active pattern ACT6. The sixth source electrode SE6 may be connected to the first drain electrode DE1 of the first transistor T1 and the third source electrode SE3 of the third transistor T3.

The sixth drain electrode DE6 may be connected to the other end of the sixth active pattern ACT6 and may be connected to a seventh transistor T7 of a pixel PXL on an (i+1)th row.

The seventh transistor T7 may include a seventh gate electrode GE7, a seventh active pattern ACT7, a seventh source electrode SE7, and the seventh drain electrode DE7.

The seventh gate electrode GE7 may be connected to the (i−1)th scan line Si−1. The seventh gate electrode GE7 may be a portion of the (i−1)th scan line Si−1 and/or may protrude from the (i−1)th scan line Si−1.

The seventh source electrode SE7 and the seventh drain electrode DE7 may be portions of a semiconductor layer doped with impurity, and the seventh active layer ACT7 may be a portion of the semiconductor layer not doped with the impurity.

The seventh active pattern ACT7 may overlap the seventh gate electrode GE7.

The seventh source electrode SE7 may be connected to one end of the seventh active pattern ACT7 and may be connected to a sixth drain electrode DE6 of a sixth transistor of a pixel PXL on the (i−1)th row.

The seventh drain electrode DE7 may be connected to the other end of the seventh active pattern ACTT and may be connected to the fourth source electrode SE4 of the fourth transistor T4. The seventh drain electrode DE7 may be connected to the initialization power line IPL through the auxiliary connection line AUX.

The storage capacitor Cst may include a lower electrode LE (or first capacitor electrode LE) and an upper electrode UE (or second capacitor electrode UE).

The lower electrode LE may be configured as or directly connected to the first gate electrode GE1 of the first transistor T1. The lower electrode LE may be integrally provided with the first gate electrode GE1.

The upper electrode UE overlaps the lower electrode LE and may substantially cover the lower electrode LE.

As the overlapping area of the upper electrode UE and the lower electrode LE is widened, the capacitance of the storage capacitor Cst may be increased. The upper electrode UE may extend in the first direction DR1.

The upper electrode UE may be connected to a corresponding power line through a third contact hole CH3. For example, the upper electrode UE of the first pixel PXL1 may be connected to the first power line PL1 through a third contact hole CH3, and the upper electrode UE of the second pixel PXL2 may be connected to the second power line PL2 through a third contact hole CH3. Therefore, a voltage having the same level as the first pixel power source ELVDD may be applied to the upper electrode UE.

The upper electrode UE may have an opening OPN. A first contact hole CH1 is positioned inside the opening OPN.

The first gate electrode GE1 and the first connection line CNL1 are connected to each other through the first contact hole CH1.

The light emitting device OLED may include a first electrode EL1, a second electrode EL2, and an emitting layer EML provided between the two electrodes EL1 and EL2.

The first electrode EL1 is provided in a light emitting region of a corresponding pixel PXL. The first electrode EL1 may be connected to the sixth drain electrode DE6 of the sixth transistor T6 and a seventh source electrode SE7 of a seventh transistor T7 of a pixel on the (i+1)th row through a ninth contact hole CH9 and a tenth contact hole CH10.

A second connection line CNL2 may be provided between the ninth contact hole CH9 and the tenth contact hole CH10. The first electrode EL1 may be connected to the sixth drain electrode DE6 and the seventh source electrode SE7 through the second connection line CNL2.

In an embodiment, each of the pixels PXL1 and PXL2 may include a shielding layer SDL.

The shielding layer SDL may overlap a corresponding data line and a corresponding power line, which are connected to the corresponding pixel PXL.

For example, the shielding layer in the first pixel PXL1 may overlap the first data line DL1 and the first power line PL1, and the shielding layer SDL in the second pixel PXL2 may overlap the second data line DL2 and the second power line PL2.

The shielding layer SDL may shield/reduce/prevent undesirable parasitic capacitance between a data line of a corresponding pixel PXL and a third transistor T3 provided a pixel PXL adjacent to the data line.

For example, the shielding layer SDL of the second pixel PXL2 may shield parasitic capacitance between the second data line DL2 and the third transistor T3 included in the first pixel PXL1.

In a high resolution display device, the number of transistors included in each pixel PXL and the number of lines connected to the transistors may be large; therefore, parasitic capacitance may be generated between some of the lines and some of the transistors.

For example, parasitic capacitance due to vertical cap coupling may be generated between the third transistor T3 of the first pixel PXL1 and the second data line DL2, which are located in different layers. The parasitic capacitance may have undesirable influence on element characteristics of the third transistor T3.

In an embodiment, the shielding layer SDL is disposed between the third transistor T3 of the first pixel PXL1 and the second data line DL2, so that cap coupling between the third transistor T3 and the second data line DL2 can be prevented or reduced.

In an embodiment, the shielding layer SDL is provided in the same layer as the upper electrode UE, and is spaced from the upper electrode UE.

The shielding layer SDL may be connected to a power line of a corresponding pixel PXL through a fifth contact hole CH5. For example, the shielding layer SDL of the first pixel PXL1 may be connected to the first power line PL1 through a fifth contact hole CH5, and the shielding layer SDL of the second pixel PXL2 may be connected to the second power line PL2 through a fifth contact hole CH5.

In an embodiment, each of the first and second pixels PXL1 and PXL2 may further include a conductive pattern CP provided on the substrate SUB.

The conductive pattern CP may overlap the first transistor T1. The conductive pattern CP may be a light shielding pattern that blocks light introduced through a back surface of the substrate SUB.

The conductive pattern CP may be made of a conductive material, e.g., a metal. The conductive pattern CP may be formed in a single metal or may be formed of two or more kinds of metals. The conductive pattern CP may have a single-layer structure or a multi-layer structure.

In an embodiment, the conductive pattern CP may include a body pattern BDP and a bridge pattern BRP.

The body pattern BDP may overlap with the first active pattern ACT1 of the first transistor T1. The body pattern BDP may be a light shielding layer that blocks light introduced through the back surface of the substrate SUB from being incident into the first active pattern ACT1.

The body pattern BDP may be provided in one or more of various shapes. In an embodiment, the body pattern BDP has a polygonal shape. In embodiments, the body pattern BDP may have one or more of a quadrangular shape, a circular shape, and an elliptical shape.

The bridge pattern BRP may have a bar shape extending in the second direction DR2 from the body pattern BDP and may be narrow than the body pattern BDP in the first direction. In an embodiment, the bridge pattern BRP may be integrally provided with and directly connected to the body pattern BDP.

The bridge pattern BRP may overlap a power line of a corresponding pixel PXL. For example, the bridge pattern BRP of the first pixel PXL1 may overlap the first power line PL1, and the bridge pattern BRP of the second pixel PXL2 may overlap the second power line PL2.

The bridge pattern BRP may overlap the shielding layer SDL of a corresponding pixel PXL. The bridge pattern BRP may be electrically connected to the shielding layer SDL through an eleventh contact hole CH11. Therefore, the first pixel power source ELVDD applied to the shielding layer SDL may be transferred to the bridge pattern BRP.

The eleventh contact hole CH11 may correspond to a corresponding power line and may be located between the (i−1)th scan line Si−1 and the ith scan line Si, which neighbor each other with no intervening scan lines, in a plan view.

For example, the eleventh contact hole CH11 of the first pixel PXL1 may correspond to the first power line PL1 and may be located between the (i−1)th scan line Si−1 and the ith scan line Si. The eleventh contact hole CH11 of the second pixel PXL2 may correspond to the second power line PL2 and may be located between the (i−1)th scan line Si−1 and the ith scan line Si.

In an embodiment, at least an edge of an eleventh contact hole CH11 may overlap a corresponding power line. A bridge pattern BRP and a corresponding shielding layer SDL are electrically and/or physically connected to each other without additional structures, so that a display device having high resolution can be easily implemented.

A structure of the display device is described along a stacking order with reference to FIGS. 4 to 12.

A conductive pattern CP including the body pattern BDP and the bridge pattern BRP may be provided on the substrate SUB. The body pattern BDP and the bridge pattern BRP may be integrally provided on the same face of the substrate SUB.

A buffer layer BFL may be provided over the body pattern BDP and the bridge pattern BRP.

The buffer layer BFL may prevent impurity from diffusing into the transistors T1 to T7. The buffer layer BFL may be provided in a single layer or in two or more layers. Two or more layers of the buffer layer BFL may be formed of the same material or different materials. The buffer layer BFL may be unnecessary according to embodiments.

The active patterns ACT1 to ACT7 may be provided on the buffer layer BFL. The active patterns ACT1 to ACT7 may be formed of a semiconductor material.

A gate insulating layer GI may be provided on the active patterns ACT1 to ACT7. The gate insulating layer GI may be an inorganic insulating layer including an inorganic material. For example, the gate insulating layer GI may include at least one of silicon nitride, silicon oxide, and silicon oxynitride.

The (i−1)th scan line Si−1, the ith scan line Si, the emission control line Ei, the gate electrodes GE1 to GE7, and the lower electrode LE of the storage capacitor Cst may be provided on the gate insulating layer GI. The lower electrode LE may be integrally provided with the first gate electrode GE1 and may directly contact the same face of the gate insulating layer GI.

The source electrodes SE1 to SE7 and the drain electrodes DE1 to DE7 are formed by doping impurity onto portion of the semiconductor material.

A first interlayer insulating layer ILD1 may be provided on the (i−1)th scan line Si−1, the ith scan line Si, the emission control line Ei, the gate electrodes GE1 to GE7, and the lower electrode LE of the storage capacitor Cst. The first interlayer insulating layer ILD1 may include the same material as the gate insulating layer GI.

The upper electrode UE of the storage capacitor Cst, the initialization power line IPL, and the shielding layer SDL may be provided on the first interlayer insulating layer ILD1.

The upper electrode UE covers the lower electrode LE. The upper electrode UE along with the lower electrode LE may constitute the storage capacitor Cst with the first interlayer insulating layer ILD1 interposed between the electrodes UE and LE.

The shielding layer SDL may be electrically connected to the bridge pattern BRP through a conductive portion disposed inside the eleventh contact hole CH11, which extends through the first interlayer insulating layer ILD1, the gate insulating layer GI, and a portion of the buffer layer BFL.

In an embodiment, the shielding layer SDL may include a contact electrode CNE that is disposed inside the eleventh contact hole CH11 and is electrically connected to the bridge pattern BRP. The contact electrode CNE may be directly connected to the bridge pattern BRP.

A second interlayer insulating layer ILD2 may be provided on the shielding layer SDL.

The data lines DL1 and DL2, the power lines PL1 and PL2, the auxiliary connection line AUX, and the connection lines CNL1 and CNL2 may be provided on the second interlayer insulating layer ILD2.

Each of the data lines DL1 and DL2 may be connected to a second source electrode SE2 of a corresponding pixel PXL through a sixth contact hole CH6 extending through a portion of the gate insulating layer GI and the interlayer insulating layers ILD1 and ILD2.

Each of the power lines PL1 and PL2 may be electrically connected to an upper electrode UE of a corresponding pixel PXL through a conductive portion disposed inside a corresponding third contact hole CH3 extending through the second interlayer insulating layer ILD2.

Each of the power lines PL1 and PL2 may be electrically connected to a fifth source electrode SE5 of a corresponding pixel PXL through a conductive portion disposed inside a corresponding fourth contact hole CH4 extending through a portion of the gate insulating layer GI and the interlayer insulating layers ILD1 and ILD2.

Each of the power lines PL1 and PL2 may be electrically connected to a shielding layer of a corresponding pixel PXL through a conductive portion disposed inside a corresponding fifth contact hole CH5 extending through the second interlayer insulating layer ILD2.

The auxiliary connection line AUX may be electrically connected to the initialization power line IPL through a conductive portion disposed inside a corresponding seventh contact hole CH7 extending through the second interlayer insulating layer ILD2.

The auxiliary power line AUX may be electrically connected to a fourth source electrode SE4 and a seventh drain electrode DE7 of a corresponding pixel PXL through a conductive portion disposed inside a corresponding eighth contact hole CH8 extending through a portion of the gate insulating layer GI and the interlayer insulating layers ILD1 and ILD2.

The first connection line CNL1 may be electrically connected to a first gate electrode GE1 of a corresponding pixel PXL through a conductive portion disposed inside a corresponding first contact hole CH1 extending through the interlayer insulating layers ILD1 and ILD2.

The first connection line CNL1 may be electrically connected to a third drain electrode DE3 and a fourth drain electrode DE4 of a corresponding pixel PXL through a conductive portion disposed inside a corresponding second contact hole CH2 extending through a portion of the gate insulating layer GI and the interlayer insulating layers ILD1 and ILD2.

The second connection line CNL2 may be electrically connected to a sixth drain electrode DE6 and a seventh source electrode SE7 of a corresponding pixel PXL through a conductive portion disposed inside a corresponding ninth contact hole CH9 extending through a portion of the gate insulating layer GI and the interlayer insulating layers ILD1 and ILD2.

A protective layer PSV may be provided on the data lines DL1 and DL2.

The first electrode EL1 may be provided on the protective layer PSV. The first electrode EL1 may be electrically connected to the second connection line CNL2 through a conductive portion disposed inside a corresponding tenth contact hole CH10 extending through the protective layer PSV. The first electrode EL1 may be connected to a sixth drain electrode DE6 and a seventh source electrode SE7 of a corresponding pixel PXL through the second connection line CNL2.

A pixel defining layer PDL defining a light emitting region of each pixel PXL may be provided on the protective layer PSV and may partially cover the first electrode EL1.

The pixel defining layer PDL exposes an upper surface of the first electrode EL1.

The emitting layer EML is provided on a portion of the first electrode EL1 exposed and surrounded by the pixel defining layer PDL, and the second electrode EL2 may be provided on the emitting layer EML.

The pixel defining layer PDL may include an organic insulating material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The emitting layer EML may be disposed on the exposed surface of the first electrode EL1. The emitting layer EML may have a multi-layered thin film structure including at least a light generation layer. For example, the emitting layer EML may include a hole injection layer for injecting holes, a hole transport layer having an excellent hole transporting property, the hole transport layer for increasing the opportunity for holes and electrons to be re-combined by suppressing the movement of electrons that have failed to combine with holes in the light generation layer, the light generation layer for emitting light through the re-combination of the injected electrons and holes, a hole blocking layer for suppressing the movement of holes that have failed to combine with electrons in the light generation layer, an electron transport layer for transporting electrons to the light generation layer, and an electron injection layer for injecting electrons.

The color of light generated in the light generation layer may be one of red, green, blue, and white. In an embodiment, the color of light generated in the light generation layer may be one of magenta, cyan, and yellow.

The hole injection layer, the hole transport layer, the hole blocking layer, the electron transport layer, and the electron injection layer may be shared by adjacent light emitting regions.

A thin film encapsulation layer TFE may cover the second electrode EL2.

The thin film encapsulation layer TFE may prevent oxygen and moisture from penetrating into the light emitting device OLED. The thin film encapsulation layer TFE may have a single-layer or multi-layer structure.

The display device according to the embodiment may include a touch sensor (not shown) provided on the thin film encapsulation layer TFE. The touch sensor may receive a touch input of a user. The touch sensor may recognize a touch event from the display device through a finger of a user or another input means.

According to embodiments, the bridge pattern BRP overlaps a power line of a corresponding pixel PXL, and the bridge pattern BRP and the shielding layer SDL can be electrically and/or physically connected to each other without complicated structures. Advantageously, the display device having high resolution can be substantially easily implemented.

According to embodiments, the body pattern BDP disposed under the first active pattern ACT1 of the first transistor T1 can serve as a light shielding pattern. Particularly, in a transparent display device in which light is introduced through the back surface of the substrate SUB, the body pattern BDP blocks light introduced through the back surface of the substrate SUB, so that the light can be prevented from being incident into the first active pattern ACT1. Advantageously, leakage current of the first transistor T1 can be minimized.

FIGS. 7 to 12 are layout/plan views schematically illustrating components of pixels (e.g., the pixels shown in FIGS. 5 and 6) in different layers of a display device according to an embodiment.

Figure 7:
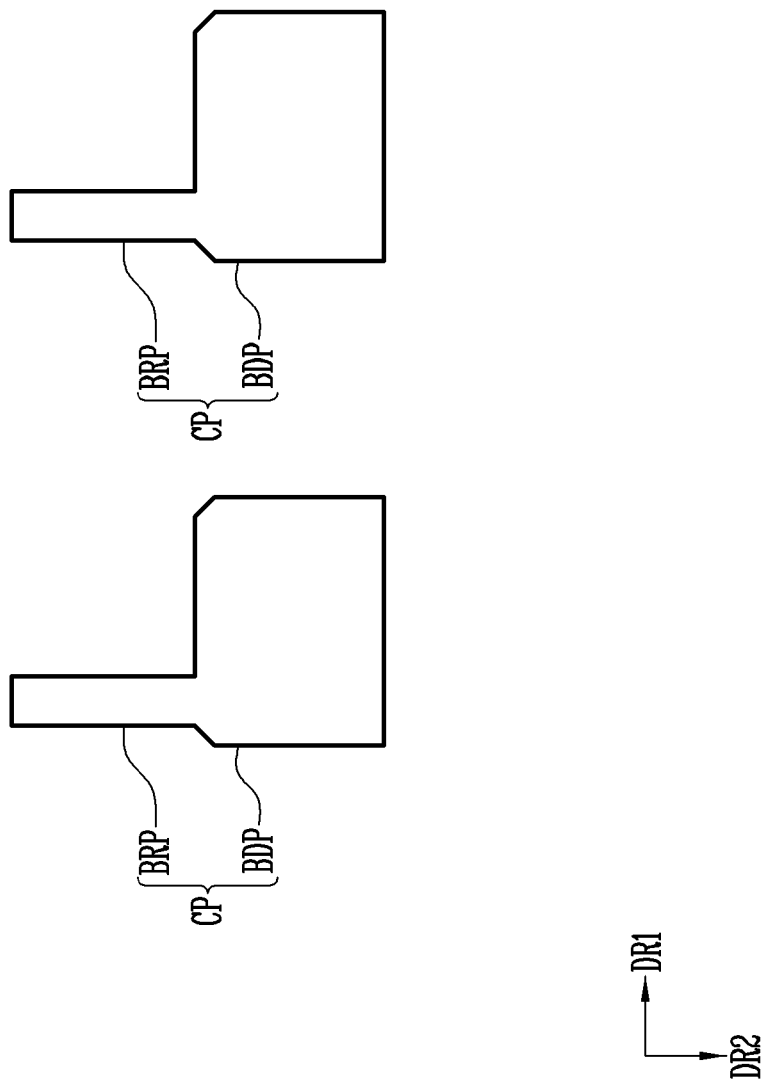
Figure 8:
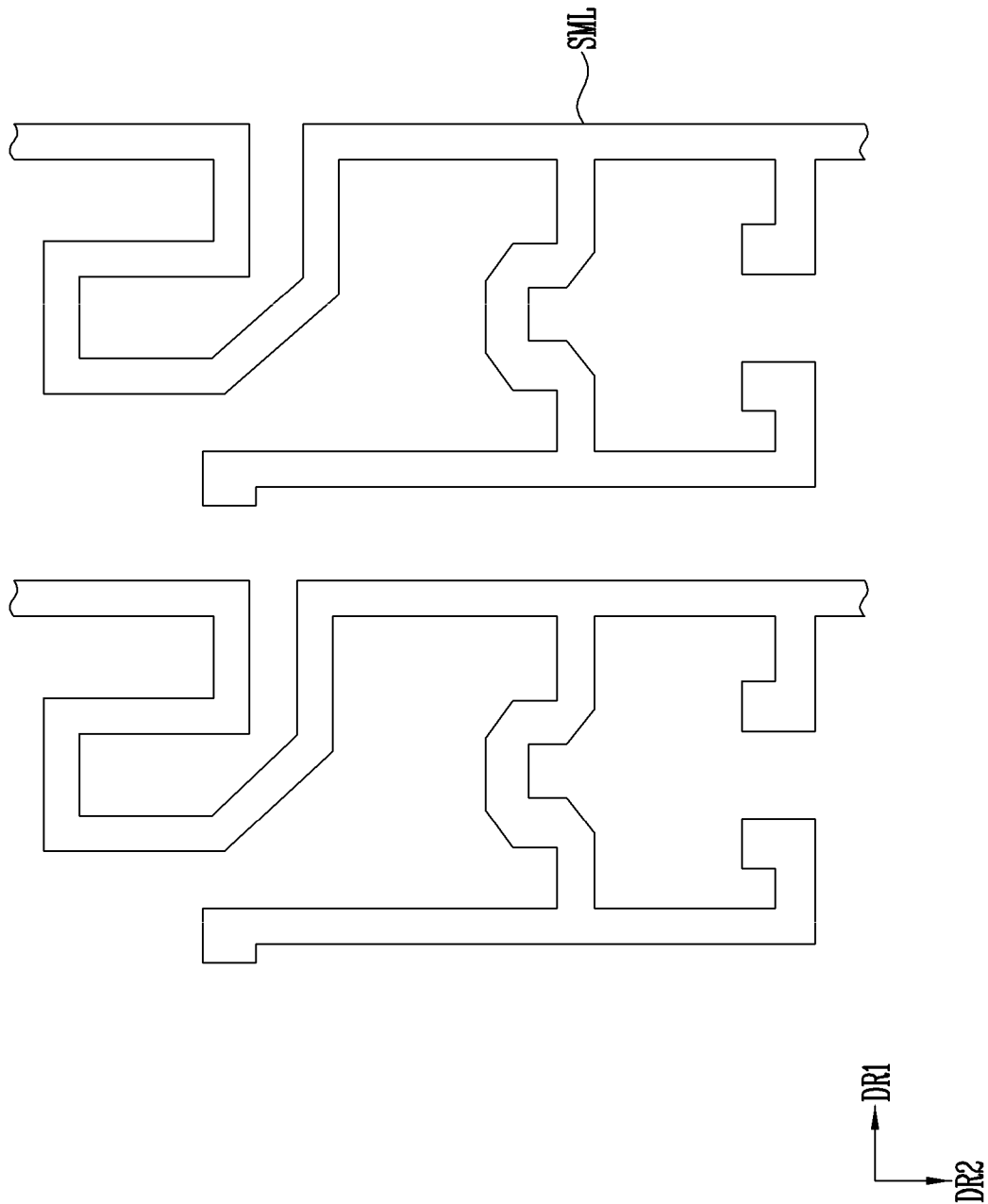
Figure 9:
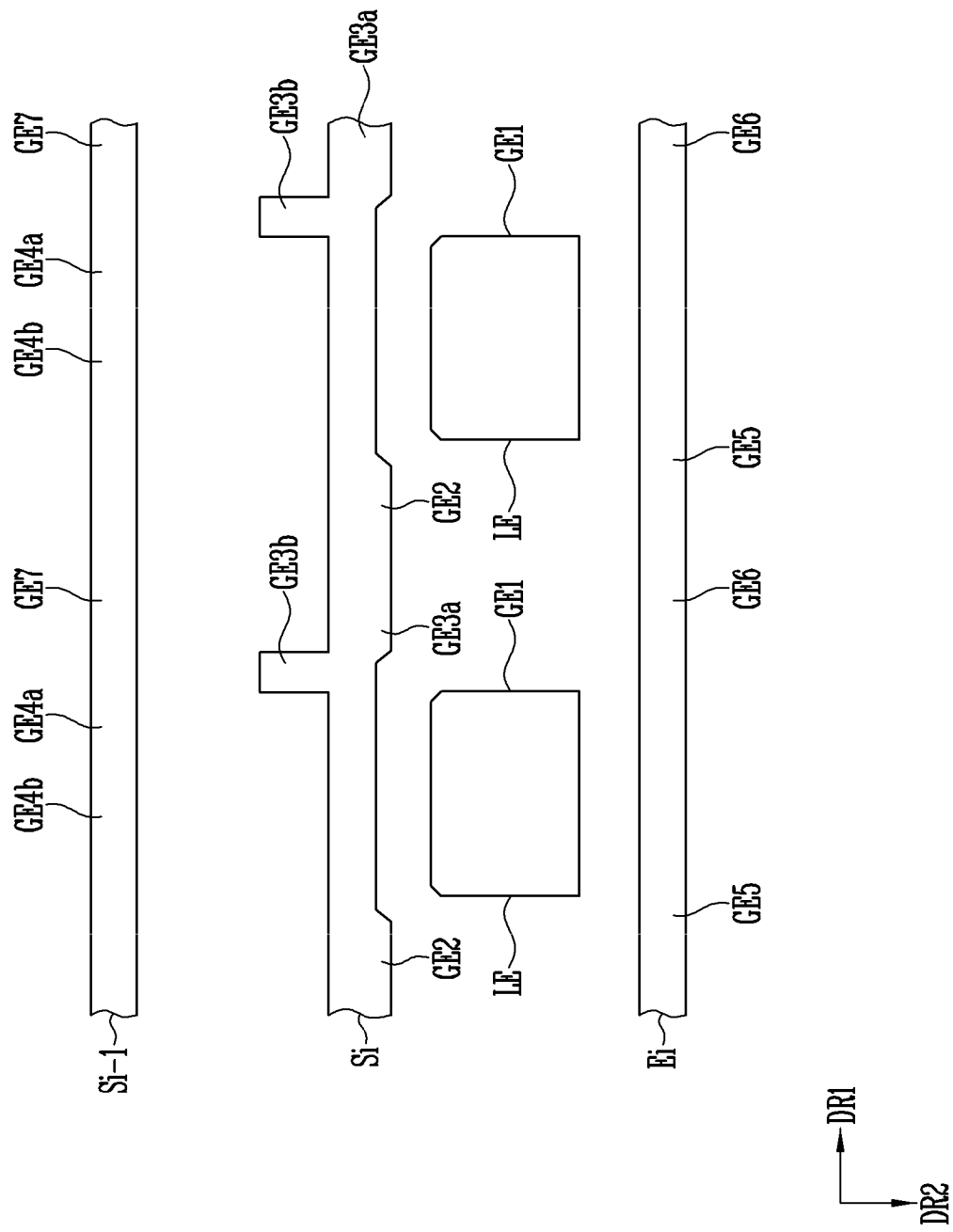
Figure 10:
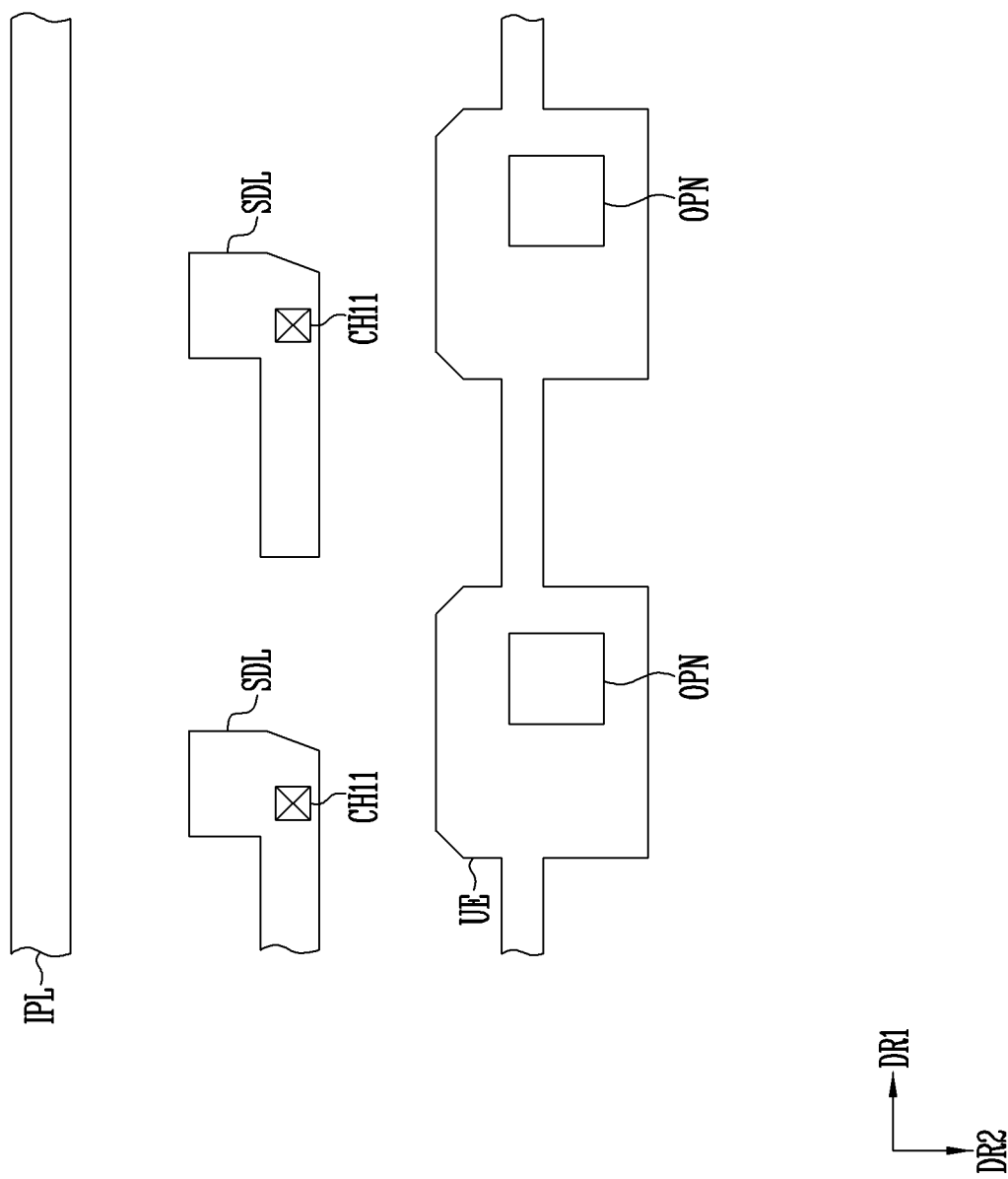
Figure 11:
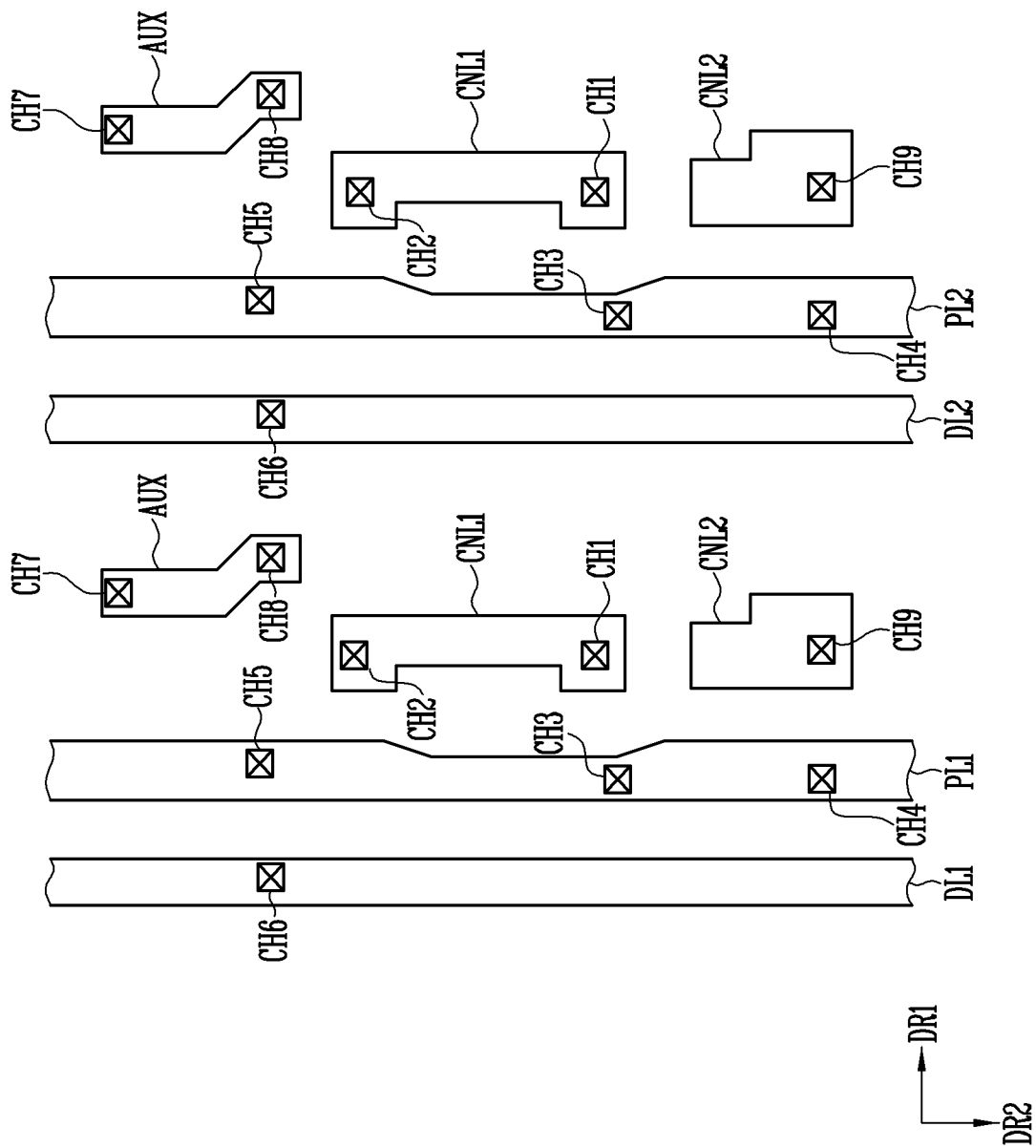

Referring to FIGS. 5 to 7, a conductive pattern CP may be provided on a substrate SUB.

The conductive pattern CP may include a body pattern BDP and a bridge pattern BRP protruding in a second direction DR2 from the body pattern BDP. The bridge pattern BRP and the body pattern BDP may be integrally provided in the same layer.

Referring to FIGS. 5 to 8, a semiconductor layer SML may be provided on the conductive pattern CP with a buffer layer BFL interposed between the members SML and CP.

The semiconductor layer SML may be made of at least one of poly-silicon, amorphous silicon, oxide semiconductor, organic semiconductor, etc. In an embodiment, the semiconductor layer SML may not be doped with impurity.

Referring to FIGS. 5 to 9, an (i−1)th scan line Si−1, an ith scan line Si, an emission control line Ei, gate electrodes GE1 to GE7, and a lower electrode LE may be provided on the semiconductor layer SML with an intervening gate insulating layer GI.

The (i−1)th scan line Si−1, the ith scan line Si, the emission control line Ei, and the gate electrodes GE1 to GE7 may overlap the semiconductor layer SML.

Subsequently, source electrodes SE1 to SE7 and f drain electrodes DE1 to DE7 may be formed by doping impurity onto portions of the semiconductor layer SML.

Referring to FIGS. 5 to 10, an initialization power line IPL, a shielding layer SDL, and an upper electrode UE may be provided on the (i−1)th scan line Si−1, the ith scan line Si, the emission control line Ei, the gate electrodes GE1 to GE7, and the lower electrode LE with an intervening first interlayer insulating layer ILD1.

The upper electrode UE may overlap the lower electrode LE and may include an opening OPN. The lower electrode LE and the upper electrode UE may constitute a storage capacitor Cst.

A shielding layer SDL may be connected to a corresponding bridge pattern BRP through a conductive portion disposed inside an eleventh contact hole CH11 extending through the first interlayer insulating layer ILD1, the gate insulating layer GI, and a portion of the buffer layer BFL.

The eleventh contact hole CH11 may be provided between the (i−1)th scan line Si−1 and the ith scan line Si in a plan view.

Referring to FIGS. 5 to 11, data lines DL1 and DL2, power lines PL1 and PL2, connection lines CNL1 and CNL2, and an auxiliary connection line AUX may be provided on the initialization power line IPL, the shielding layer SDL, and the upper electrode UE with an intervening second interlayer insulating layer ILD2.

Referring to FIGS. 5 to 12, first electrodes EL1 may be provided on the data lines DL1 and DL2, the power lines PL1 and PL2, the connection lines CNL1 and CNL2, and the auxiliary connection line AUX with an intervening protective layer PSV.

A first electrode EL1 may be connected to a corresponding second connection line CNL2 through a tenth contact hole CH10 extending through the protective layer PSV.

A pixel defining layer PDL may partially cover the first electrode ELL and an emitting layer EML and a second electrode EL2 may be sequentially provided in a light emitting region of each pixel PXL surrounded by the pixel defining layer PDL.

A thin film encapsulation layer TFE is formed over the second electrode EL2.

A high resolution display device according to an embodiment can be employed in various electronic devices. For example, high resolution display devices according to embodiments may be applicable to televisions, notebook computers, cellular phones, smart phones, smart pads, PMPs, PDAs, navigations, various wearable devices such as smart watches, and the like.

Although embodiments have been described as examples, various changes in form and details may be made without departing from the scope set forth in the following claims.

What is claimed is:

1. A display device comprising:
   a first scan line extending in a first direction and configured for transferring a first scan signal;
   a data line extending in a second direction different from the first direction and configured for transferring a data signal;
   a power line spaced from the data line and configured for transferring a driving voltage;
   a substrate;
   a first transistor overlapping the substrate;
   a second transistor electrically connected to each of the first scan line, the data line, and the first transistor;
   a light emitting device electrically connected to the first transistor;
   a light shielding member disposed between the substrate and the first transistor; and
   a shielding layer electrically connected to the power line,
   wherein the light shielding member includes a body member and a bridge member, the body member overlapping the first transistor, the bridge member being narrower than the body member in the first direction, extending in the second direction from the body member, and overlapping the shielding layer.

2. The display device of claim 1, wherein the first transistor includes:
   a first semiconductor member;
   a first source electrode and a first drain electrode, each connected to the first semiconductor member;
   a first gate electrode overlapping the body member and overlapping the first semiconductor member; and
   a gate insulating layer disposed between the first gate electrode and the first semiconductor member,
   wherein the first semiconductor member is disposed between the body member and the first gate electrode.

3. The display device of claim 2, further comprising:
   a buffer layer disposed between the first semiconductor member and the light shielding member.

4. The display device of claim 3, further comprising:
   a first interlayer insulating layer disposed between the first gate electrode and the shielding layer; and
   a second interlayer insulating layer disposed over the shielding layer.

5. The display device of claim 4, wherein the bridge member is electrically connected to the shielding layer through a first conductive portion disposed inside a first contact hole extending through the first interlayer insulating layer, the gate insulating layer, and a portion of the buffer layer.

6. The display device of claim 5, further comprising:
   a second scan line configured for transferring a second scan signal,
   wherein no intervening scan line is disposed between the first scan line and the second scan line, and
   wherein the first contact hole is provided between the first scan line and the second scan line.

7. The display device of claim 6, wherein a portion of the bridge member overlaps the power line and is positioned between the first scan line and the second scan line.

8. The display device of claim 7, wherein the power line is electrically connected to the shielding layer through a second conductive portion disposed inside a second contact hole extending through the second interlayer insulating layer.

9. The display device of claim 8, wherein the driving voltage transferred by the power line is applied to each of the shielding layer and the bridge member.

10. The display device of claim 8, wherein the shielding layer partially overlaps each of the data line, the power line, and the bridge member.

11. The display device of claim 4, further comprising:
a first capacitor electrode disposed on the gate insulating layer; and
a second capacitor electrode disposed on the first interlayer insulating layer,
wherein the first capacitor electrode and the second capacitor electrode constitute a storage capacitor, and
wherein the first interlayer insulating layer is interposed between the first capacitor electrode and the second capacitor electrode.

12. The display device of claim 11, wherein the first capacitor electrode and the first gate electrode are directly connected to each other and direct contact the same face of the gate insulating layer.

13. The display device of claim 12, wherein the second capacitor electrode and the shielding layer direct contact the same face of the first interlayer insulating layer.

14. The display device of claim 6, further comprising:
a third transistor including a third source electrode electrically connected to the first gate electrode, a third drain electrode electrically connected to a node disposed between the first transistor and the light emitting device, and a third gate electrode electrically connected to the second scan line.

15. The display device of claim 14, wherein a portion of the shielding layer is disposed between the third transistor and the data line in a plan view of the display device.

16. The display device of claim 15, wherein the third transistor and the data line are provided in different layers of the display device.

17. A display device comprising:
a substrate;
a first scan line extending in a first direction and configured for transferring a first scan signal;
a second scan line spaced from the first scan line and configured for transferring a second scan signal, wherein no intervening scan line is disposed between the first scan line and the second scan line;
a data line extending in a second direction, intersecting each of the first scan line and the second scan line, and configured for transferring a data signal;
a power line spaced apart from the data line and configured for transferring a driving voltage;
a substrate;
a first transistor overlapping the substrate and comprising a semiconductor member;
a second transistor electrically connected to each of the first transistor, the first scan line, the second scan line, and the data line, the second transistor being configured to turn on in response to the second scan signal;
a light emitting device electrically connected to the first transistor and configured for emitting light;
a light shielding member including a body member and a bridge member, the body member being disposed between the substrate and the semiconductor member of the first transistor, the bridge member extending in the second direction from the body member and being electrically connected to the power line; and
a shielding layer partially overlapping the bridge member, wherein the bridge member is electrically connected to the power line through the shielding layer.

18. The display device of claim 17, further comprising:
a buffer layer disposed over the light shielding member;
a gate insulating layer disposed over the semiconductor member; and
a first interlayer insulating layer disposed over the first scan line and the second scan line,
wherein the bridge member is electrically connected to the shielding layer through a first conductive portion disposed inside a first contact hole extending through the first interlayer insulating layer, the gate insulating layer, and a portion of the buffer layer.

19. The display device of claim 18, wherein the first contact hole is provided between the first scan line and the second scan line.

20. The display device of claim 18, further comprising:
a second interlayer insulating layer disposed between the shielding layer and the power line,
wherein the power line is electrically connected to the shielding layer through a second conductive portion disposed inside a second contact hole extending through the second interlayer insulating layer.

* * * * *